United States Patent
Huang et al.

(10) Patent No.: US 11,142,820 B2
(45) Date of Patent: Oct. 12, 2021

(54) HIGH REFRACTIVE INDEX HYDROGENATED SILICON CARBIDE AND PROCESS

(71) Applicant: Seagate Technology LLC, Cupertino, CA (US)

(72) Inventors: Xiaoyue Huang, Edina, MN (US); Deming Zhang, Eagan, MN (US); Minna Hovinen, Edina, MN (US); Ziyou Zhou, Edina, MN (US)

(73) Assignee: Seagate Technology LLC, Fremont, CA (US)

( * ) Notice: Subject to any disclaimer, the term of this patent is extended or adjusted under 35 U.S.C. 154(b) by 0 days.

(21) Appl. No.: 16/250,488

(22) Filed: Jan. 17, 2019

(65) Prior Publication Data
US 2020/0232093 A1    Jul. 23, 2020

(51) Int. Cl.
*C23C 16/32* (2006.01)
*G02B 6/02* (2006.01)
*C01B 32/963* (2017.01)
*C23C 16/453* (2006.01)

(52) U.S. Cl.
CPC .......... *C23C 16/325* (2013.01); *C01B 32/963* (2017.08); *C23C 16/453* (2013.01); *G02B 6/021* (2013.01)

(58) Field of Classification Search
CPC ............ C23C 16/325; C23C 16/45502; C23C 16/505–5096; C01B 32/956; C01B 32/963
USPC ................................. 427/563, 574, 575, 578
See application file for complete search history.

(56) References Cited

U.S. PATENT DOCUMENTS

| | | | | |
|---|---|---|---|---|
| 5,011,706 A | * | 4/1991 | Tarhay | C23C 16/325 427/573 |
| 5,800,878 A | | 9/1998 | Yao | |
| 6,077,722 A | * | 6/2000 | Jansen | B32B 17/10036 136/249 |
| 6,100,466 A | * | 8/2000 | Nishimoto | C23C 16/24 136/258 |
| 6,121,541 A | * | 9/2000 | Arya | H01L 31/0322 136/249 |
| 7,043,133 B2 | | 5/2006 | Johnson et al. | |
| 9,672,848 B2 | * | 6/2017 | Blaber | G11B 5/314 |
| 10,106,889 B2 | * | 10/2018 | Chen | C23C 16/325 |
| 2003/0049388 A1 | * | 3/2003 | Cho | C23C 16/325 427/569 |
| 2003/0155074 A1 | * | 8/2003 | Yao | F23G 5/28 156/345.26 |
| 2010/0021836 A1 | * | 1/2010 | Ozawa | G03G 13/22 430/66 |
| 2010/0284088 A1 | * | 11/2010 | Zambov | G02B 5/285 359/586 |
| 2012/0279564 A1 | * | 11/2012 | Abe | C23C 14/24 136/256 |
| 2013/0061915 A1 | * | 3/2013 | Myong | H01L 31/075 136/255 |
| 2013/0270239 A1 | * | 10/2013 | Wu | B23K 26/0846 219/121.72 |
| 2016/0133287 A1 | * | 5/2016 | Chen | C23C 16/325 369/13.33 |

OTHER PUBLICATIONS

Richard J Lewis, Sr., editor; Hawley's Condensed Chemical Dictionary, 12th edition; Van Nostrand Reinhold Company, New York; 1993 (no month); excerpts pp. 104-105 & 305.*
Petrich, Mark A., et al., "Structure and properties of amorphous hydrogenated silicon carbide". Physical Review B vol. 36, No. 18 Dec. 15, 1987-II, pp. 9722-9731.*
Chen, Enlong, et al., "RF-PECVD deposition and optical properties of hydrogenated amorphous silicon carbide thin films". Ceramics International vol. 40, Issue 7, Part A, Aug. 2014, pp. 9791-9797.*
Wrobel, A.M., et al., "High-quality amorphous hydrogenated silicon carbide coatings by remote plasma chemical vapor deposition from a single-source precursor". Journal of Materials Processing Technology 53 (1995) 477482.*
Prado, R.J., et al., "Improvements on the local order of amorphous hydrogenated silicon carbide films". Journal of Non-Crystalline Solids 283 (2001) pp. 1-10.*
Standaert, T.E.F.M., et al., "Role of fluorocarbon film formation in the etching of silicon, silicon dioxide, silicon nitride, and amorphous hydrogenated silicon carbide". Journal of Vacuum Science & Technology A 22, 53 (2004); doi: 10.1116/1.1626642.*
Kuhman, Dan, et al., "Properties of hydrogenated amorphous silicon carbide films prepared by plasma-enhanced chemical vapor deposition". Thin Solid Films, vol. 177, Issues 1-2, Oct. 1989, pp. 253-262 Abstract Only.*
Huran et al., "Amorphous silicon carbide thin films deposited by plasma enhanced chemical vapor deposition at different temperature for hard environment applications", 21st International Symposium on Plasma Chemistry (ISPC 21), Aug. 4, 2013-Aug. 9, 2013, 5 pages, Queensland, Australia.
Pham et al., "Electrical and Optical Properties of PECVD SiC Thin Films for Surface Micromachined Devices", Delft University of Technology, 2012, 5 pages, p. 662-666; publication source unspecified.

(Continued)

*Primary Examiner* — Bret P Chen
(74) *Attorney, Agent, or Firm* — Kagan Binder, PLLC

(57) ABSTRACT

In a method for depositing a layer of amorphous hydrogenated silicon carbide (SiC:H), a gas mixture comprising a reactive gas to inert gas volume ratio of 1:12 to 2:3 is introduced into a reaction chamber of a plasma-enhanced chemical vapor deposition apparatus. The reactive gas has a ratio of Si of 50 to 60, C of 3 to 13, and H of 32 to 42 at %. The inert gas comprises i) a first inert gas selected from helium, neon and mixtures; and ii) a second inert gas selected from argon, krypton, xenon and mixtures. The reaction plasma is at a power frequency of 1-16 MHz at a power level of 100 W to 700 W. The resulting layer exhibits a refractive index of not less than 2.4 and a loss of not more than 180 dB/cm at an indicated wavelength within 800 to 900 nm.

11 Claims, No Drawings

HIGH REFRACTIVE INDEX HYDROGENATED SILICON CARBIDE AND PROCESS

BACKGROUND

In thermally assisted magnetic/optical recording, information bits are recorded to a storage layer of a storage media at elevated temperatures. Generally, a spot or bit on the storage medium is heated to reduce its coercivity sufficiently so that an applied magnetic field or optical write signal can record data to the storage medium. Current methods of heating the storage media include directing and focusing energy onto the storage media. Different and more advantageous methods and devices for focusing the energy are needed in order to decrease the size of the heated spot in order to increase the storage density of the storage media.

Waveguides that include a top cladding layer; a bottom cladding layer; and a core layer positioned between the top cladding layer and the bottom cladding layer, the core layer including amorphous hydrogenated silicon carbide (SiC:H), or bismuth titanate are described in US2016/0133287 to Chen.

SUMMARY

High refractive index materials with low loss are particularly desired for use in heat assisted magnetic recording ("HAMR") devices and methods. Such materials better confine light source focusing on near field transducers ("NFT"). However, it is very difficult to prepare a hydrogenated silicon carbide material having a refractive index that is greater than 2.4 with low optical loss at wavelengths of about 825 nm. A Plasma Enhanced Chemical Vapor Deposition ("PECVD") Silicon Carbide ("SiC") process is disclosed that provides exceptional materials.

Specifically, a method for depositing a layer of amorphous hydrogenated silicon carbide (SiC:H) comprises introducing a gas mixture comprising a reactive gas and an inert gas at a reactive gas to inert gas volume ratio of from 1:12 to 2:3 into a reaction chamber of a plasma-enhanced chemical vapor deposition apparatus. The reactive gas comprises a silicon source and a carbon source, the gas having an atomic concentration ratio of Si of from 50 to 60, C of from 3 to 13, and H of from 32 to 42 at %. The inert gas comprises i) a first inert gas selected from the group consisting of helium, neon and mixtures thereof and ii) a second inert gas selected from the group consisting of argon, krypton, xenon and mixtures thereof. The inert gas has a volume ratio of first inert gas to second inert gas of from 2:5 to 6:5. The reactive gas is reacted in the presence of a plasma under defined conditions that provide excellent amorphous hydrogenated silicon carbide materials. The reaction conditions comprise generating the plasma using power at a frequency of from about 1 to 16 MHz at a power level of from 100 W to 700 W. The reactive gas and the inert gas are introduced at gas flow rates and plasma conditions sufficient to provide an amorphous hydrogenated silicon carbide layer that exhibits a refractive index of not less than 2.4 and a loss of not more than 180 dB/cm at an indicated wavelength within the range of within the range of from about 800 to 900 nm. In an embodiment, the reactive gas and the inert gas are introduced at gas flow rates and plasma conditions sufficient to provide an amorphous hydrogenated silicon carbide layer that exhibits a refractive index of not less than 2.4 and a loss of not more than 180 dB/cm at a wavelength of 825 nm.

DETAILED DESCRIPTION

In the method as described herein, a reactive gas comprising a silicon source and a carbon source is introduced, together with an inert gas, into a reaction chamber of a plasma-enhanced chemical vapor deposition apparatus.

For purposes of the present disclosure, the volume ratios of any gases in the reaction chamber are calculated from the respective flow rates of the gases in SCCM (i.e., Standard Cubic Centimeters per Minute).

Any of a number of precursors can be utilized as carbon sources, including for example methane ($CH_4$), propene ($C_3H_6$), propane ($C_3H_8$), hexane $C_6H_{14}$), xylene ($C_8H_{10}$), or combinations thereof.

Likewise, any of a number of precursors can be utilized as silicon sources, including for example, silane ($SiH_4$), disilane ($Si_2H_6$), tetrachlorosilane ($SiCl_4$), or combinations thereof.

In an embodiment, the reactive gas comprises a silicon source comprising silane ($SiH_4$) and a carbon source comprising methane ($CH_4$). In an embodiment, the reactive gas consists of a silicon source consisting of silane ($SiH_4$) and a carbon source consisting of methane ($CH_4$).

In an embodiment, the reactive gases are separately introduced into the plasma-enhanced chemical vapor deposition apparatus at flow rates that provide the gases in the required ratios. In an embodiment, the reactive gases are premixed in the desired ratios, and introduced after premixing into the plasma-enhanced chemical vapor deposition apparatus.

The reactive gas/inert gas combinations are introduced into a reaction chamber in source selection and relative flow rates such that the gas in the reaction chamber has an atomic concentration ratio of Si of from 50 to 60, C of from 3 to 13, and H of from 32 to 42 at %. In an embodiment, the gas in the reaction chamber has an atomic concentration ratio of Si of from 52 to 58, C of from 5 to 11, and H of from 34 to 40 at %. In an embodiment, the gas in the reaction chamber has an atomic concentration ratio of Si of from 54 to 56, C of from 7 to 9, and H of from 36 to 38 at %.

In an embodiment, the reactive gas is introduced at a total gas flow rate of from 1000 sccm to 4000 sccm. In an embodiment, the reactive gas is introduced at a total gas flow rate of from 1200 sccm to 4000 sccm. In an embodiment, the reactive gas is introduced at a total gas flow rate of from 2500 sccm to 4000 sccm.

In an embodiment, the carbon source reactive gas is introduced into the plasma-enhanced chemical vapor deposition apparatus at a flow rate of from 800 sccm to 3000 sccm. In an embodiment, the carbon source reactive gas is introduced into the plasma-enhanced chemical vapor deposition apparatus at a flow rate of from 1500 sccm to 3000 sccm. In an embodiment, the carbon source reactive gas is introduced into the plasma-enhanced chemical vapor deposition apparatus at a flow rate of from 1500 sccm to 2000 sccm. In an embodiment, the carbon source reactive gas is introduced into the plasma-enhanced chemical vapor deposition apparatus at a flow rate of from 2000 sccm to 3000 sccm.

In an embodiment, the silicon source reactive gas is introduced into the plasma-enhanced chemical vapor deposition apparatus at a flow rate of from 400 sccm to 1200 sccm. In an embodiment, the silicon source reactive gas is introduced into the plasma-enhanced chemical vapor deposition apparatus at a flow rate of from 400 sccm to 600 sccm. In an embodiment, the silicon source reactive gas is introduced into the plasma-enhanced chemical vapor deposition apparatus at a flow rate of from 700 sccm to 1100 sccm.

In an embodiment, the gas in the reaction chamber has an atomic concentration ratio of Si of 52 to 58, C of 3 to 13, and H of 36 to 39 at %; the plasma is generated at a power level of from 100 W to 400 W; the reactive gas is introduced at a total gas flow rate of from 1000 sccm to 4000 sccm, and the inert gas is introduced at a total gas flow rate of from 6000 sccm to 12,000 sccm; and the reaction of the reactive gas in the presence of a plasma is carried out at a substrate temperature of from 200° C. to 225° C.

In an embodiment, the reactive gas and an inert gas are present in the reaction chamber of a plasma-enhanced chemical vapor deposition apparatus at a reactive gas to inert gas volume ratio of from 1:6 to 1:2. In an embodiment, the reactive gas and an inert gas are present in the reaction chamber of a plasma-enhanced chemical vapor deposition apparatus at a reactive gas to inert gas volume ratio of from 1:12 to 1:3. In an embodiment, the reactive gas and an inert gas are present in the reaction chamber of a plasma-enhanced chemical vapor deposition apparatus at a reactive gas to inert gas volume ratio of from 1:3 to 1:2.

The inert gas comprises i) a first inert gas selected from the group consisting of helium, neon and mixtures thereof and ii) a second inert gas selected from the group consisting of argon, krypton, xenon and mixtures thereof, the inert gas having a volume ratio of first inert gas to second inert gas of from 2:5 to 6:5. In an embodiment, the inert gas has a volume ratio of first inert gas to second inert gas of from 3:5 to 5:5.

In an embodiment, the inert gases are introduced at a total gas flow rate of from 6000 sccm to 12,000 sccm. In an embodiment, the first inert gas is introduced into the plasma-enhanced chemical vapor deposition apparatus at a flow rate of from 2000 sccm to 6000 sccm. In an embodiment, the first inert gas is introduced into the plasma-enhanced chemical vapor deposition apparatus at a flow rate of from 3000 sccm to 5000 sccm. In an embodiment, the second inert gas is introduced into the plasma-enhanced chemical vapor deposition apparatus at a flow rate of from 3000 sccm to 7,000 sccm. In an embodiment, the second inert gas is introduced into the plasma-enhanced chemical vapor deposition apparatus at a flow rate of from 4000 sccm to 6,000 sccm.

In an embodiment, the reactive gas may comprise small amounts of additional gaseous precursors to form a doped amorphous hydrogenated silicon carbide. In an embodiment, the gaseous precursors are selected from the group consisting of nitrogen (such as ammonium), fluorine, chlorine, germanium, boron, oxygen or phosphorus may be added to form a doped amorphous hydrogenated silicon carbide. In an embodiment, the additional gaseous precursors are added in an amount such that the volume ratio of additional gaseous precursors to reactive gas is from 1:200 to 1:13.

In some embodiments, the amount of carbon and silicon can be controlled by controlling the flow rates of precursor gases to the CVD chamber. The flow rates of the precursor gases are of course dependent, at least in part, on the number of precursor atoms provided by the gas (e.g., the flow rate of methane would likely be higher than that of xylene because xylene provides eight (8) times the carbon). In some embodiments, a carbon source can have a flow rate not less than 120 standard cubic centimeters per minute (sccm), not less than 200 sccm, or not less than 5000 sccm, depending at least in part on the particular chemical composition of the carbon source. In some embodiments, a carbon source can have a flow rate not greater than 7000 sccm, not greater than 1000 sccm, or not greater than 6000 sccm, depending at least in part on the particular chemical composition of the carbon source. In some embodiments, a silicon source can have a flow rate of not less than 100 sccm, or not less than 200 sccm, depending at least in part on the particular chemical composition of the silicon source. In some embodiments, a silicon source can have a flow rate of not greater than 500 sccm, or not greater than 300 sccm, depending at least in part on the particular chemical composition of the silicon source.

In some embodiments, the reactive gas and the inert gas are introduced at gas flow rates sufficient to provide a deposition rate of amorphous hydrogenated silicon carbide of from about 2 nm/sec to about 12 nm/sec. In some embodiments, the reactive gas and the inert gas are introduced at gas flow rates sufficient to provide a deposition rate of amorphous hydrogenated silicon carbide of from about 2 nm/sec to about 6 nm/sec.

The reactive gas is reacted in the presence of a plasma that is generated using power at a frequency of from about 1-16 MHz at a power level of not more than 600 W. In an embodiment, the plasma is generated at a power level of not more than 500 W. In an embodiment, the plasma is generated at a power level of not more than 400 W. In an embodiment, the plasma is generated at a power level of not more than 300 W. In an embodiment, the plasma is generated at a power level of from 50 W to 500 W. In an embodiment, the plasma is generated at a power level of from 50 W to 300 W.

In an embodiment, the reaction of the reactive gas in the presence of a plasma is carried out at a substrate temperature of not more than 250° C. In an embodiment, the reaction of the reactive gas in the presence of a plasma is carried out at a substrate temperature of from 150° C. to 225° C. In an embodiment, the reaction of the reactive gas in the presence of a plasma is carried out at a substrate temperature of from 200° C. to 225° C. It has been discovered that methods carried out in accordance with the present process conditions, but at a process temperature of more than 250° C. generally need to be modified by substantial modifications in other process parameters (such as gas ratios, flow rates and/or reaction chamber pressures) to prepare amorphous hydrogenated silicon carbide, and still may not reliably produce materials exhibiting the desired optical properties.

Any suitable plasma-enhanced chemical vapor deposition apparatus that can carry out the presently described process conditions may be used in the present method to prepare the materials described herein. In an embodiment, the reaction chamber pressure is maintained at a pressure of from 4.6 to 5.2 Torr.

In an embodiment, the process as described herein provides a layer of amorphous hydrogenated silicon carbide (SiC:H), in an atomic concentration ratio of Si of from 50 to 60, C of from 3 to 13, and H of from 32 to 42 at %, and having an assumed density of from 1 E22 to 1 E23 at/cc. In an embodiment, the amorphous hydrogenated silicon carbide exhibits an assumed density of from 8 E22 to 9 E22 at/cc. In an embodiment, the amorphous hydrogenated silicon carbide exhibits a refractive index n of not less than 2.4 and a loss of not more than 180 dB/cm at a wavelength of 825 nm.

In an embodiment, the amorphous hydrogenated silicon carbide exhibits a refractive index n of not less than 2.4. In an embodiment, the amorphous hydrogenated silicon carbide exhibits a refractive index n of not less than 2.5. In an embodiment, the amorphous hydrogenated silicon carbide exhibits a refractive index n of not less than 2.6. In an embodiment, the amorphous hydrogenated silicon carbide exhibits a refractive index n of not less than 2.7. In an embodiment, the amorphous hydrogenated silicon carbide exhibits a refractive index n of not less than 2.8. In an embodiment, the amorphous hydrogenated silicon carbide exhibits a refractive index n of not less than 2.9.

In an embodiment, the amorphous hydrogenated silicon carbide exhibits a loss of not more than 160 dB/cm at a wavelength of 825 nm. In an embodiment, the amorphous hydrogenated silicon carbide exhibits a loss of not more than 150 dB/cm at a wavelength of 825 nm. In an embodiment, the amorphous hydrogenated silicon carbide exhibits a loss of not more than 140 dB/cm at a wavelength of 825 nm. In an embodiment, the amorphous hydrogenated silicon carbide exhibits a loss of not more than 120 dB/cm at a wavelength of 825 nm. In an embodiment, the amorphous hydrogenated silicon carbide exhibits a loss of not more than 100 dB/cm at a wavelength of 825 nm. In an embodiment, the amorphous hydrogenated silicon carbide exhibits a loss of not more than 90 dB/cm at a wavelength of 825 nm. In an embodiment, the amorphous hydrogenated silicon carbide exhibits a loss of not more than 80 dB/cm at a wavelength of 825 nm. In an embodiment, the amorphous hydrogenated silicon carbide exhibits a loss of not more than 70 dB/cm at a wavelength of 825 nm. In an embodiment, the amorphous hydrogenated silicon carbide exhibits a loss of not more than 60 dB/cm at a wavelength of 825 nm. In an embodiment, the amorphous hydrogenated silicon carbide exhibits a loss of not more than 50 dB/cm at a wavelength of 825 nm.

Typically, refractive index and loss are important in material used in waveguides and in storage media applications at wavelengths of from about 800 to 900 nm. In an embodiment, measurement of refractive index and loss is taken at a selected wavelength within this range to be representative for identification of materials to be used with light at any specific value within this this range. In embodiments, the amorphous hydrogenated silicon carbide materials as described herein are contemplated to be used with a laser light source having a specific wavelength within the range, and the above noted refractive index and loss values are advantageously exhibited for that value within the range of from about 800 to 900 nm. In embodiments, the above noted refractive index and loss values are exhibited at a wavelength of 830 nm, or at a wavelength of 875 nm. In embodiments, the above noted refractive index and loss values are exhibited at all wavelengths of light from 800 to 900 nm.

In some embodiments, the layer of amorphous hydrogenated silicon carbide may have a thickness, in the z direction, of not less than 100 nm and not greater than 150 nm. In some embodiments, disclosed layer of amorphous hydrogenated silicon carbide can have a thickness in the z direction of not less than 75 nm, not less than 80 nm, or not less than 85 nm, for example. In some embodiments, the layer of amorphous hydrogenated silicon carbide can have a thickness in the z direction of not greater than 110 nm, not greater than 100 nm, or not greater than 95 nm, for example.

In an embodiment, once the SiC:H has been deposited, the material can be annealed. Annealing the deposited material can serve to further decrease the intrinsic optical transition in the near-infrared region and make the material particularly advantageous for use as a core layer of a waveguide at relevant wavelengths (e.g., 825 nm). In some embodiments, post annealing can utilize temperatures not less than 200° C., not less than 210° C., or not less than 220° C., for example. In some embodiments, post annealing can utilize temperatures not greater than 250° C.

Devices comprising the amorphous hydrogenated silicon carbide as described herein can offer the advantage of providing more confined light propagation and also allow the design of thinner core thicknesses, which can deliver a more focused thermal spot onto the recording media by increasing the thermal gradient. These advantages are realized through the use of different core material. Disclosed devices include core materials that have higher refractive indices while still maintaining very low optical loss at relevant wavelengths. In some embodiments, disclosed devices can be used within other devices or systems, such as magnetic recording heads, more specifically, thermally or heat assisted magnetic recording (HAMR) heads, or disc drives that include such devices.

In an embodiment, the amorphous hydrogenated silicon carbide as described herein is used as a core material in a waveguide include a bottom cladding layer, a core layer and a top cladding layer such as disclosed in US Patent Publication 2016/0133287, the disclosure of which is incorporated by reference herein. In an embodiment, the bottom cladding layer can be made of $SiO_2$, for example. In some embodiments, the top cladding layer may be formed of a material such as, for example $SiO_2$, $MgF_2$, $Al_2O_3$, $Si_3N_4$, $SiO_xN_y$, porous silica, or combinations thereof. The top and bottom cladding layers can be the same or different materials.

In some embodiments, the material of the core layer has a refractive index of not less than 2.4, or not less than 2.5, or not less than 2.6, or not less than 2.7, or not less than 2.8, or not less than 2.9. In contrast, the material of either or both of the bottom and top cladding layers may have a refractive index of about 1.0 to about 2.

EXAMPLES

The following tables provide process parameters and physical property characteristics of CVD process Examples 1-27 (examples 1-5 being comparative examples).

TABLE 1A

| Sample | Note[1] | Temp °C. | Pressure Torr | Plasma Power W | He (5000 scc max) | Ar (5000 scc max) | SiH4-HI (1000 scc max) | CH4 (10 slm max 125-7200) |
|---|---|---|---|---|---|---|---|---|
| 1 (comp) | LILR | 200 | 4.8 | 600 | 2000 | 2500 | 500 | 500 |
| 2 (comp) | LILR | 200 | 4.8 | 600 | 2000 | 2500 | 500 | 560 |
| 3 (comp) | HIHR-HPw | 200 | 4.8 | 600 | 4000 | 5000 | 1000 | 1100 |
| 4 (comp) | HIHR-HPw | 200 | 4.8 | 600 | 4000 | 5000 | 1000 | 1000 |
| 5 (comp) | HIHR-HPw | 200 | 4.8 | 600 | 4000 | 5000 | 1000 | 1200 |

TABLE 1A-continued

| Sample | Note[1] | Temp °C. | Pressure Torr | Plasma Power W | He (5000 scc max) | Ar (5000 scc max) | SiH4-HI (1000 scc max) | CH4 (10 slm max 125-7200) |
|---|---|---|---|---|---|---|---|---|
| 6 | HIHR-HPw | 200 | 4.8 | 600 | 4000 | 5000 | 1000 | 1300 |
| 7 | HIHR-HPw | 200 | 4.8 | 600 | 4000 | 5000 | 1000 | 1400 |
| 8 | HIHR-HPw | 200 | 4.8 | 600 | 4000 | 5000 | 1000 | 1500 |
| 9 | HIHR-HPw | 200 | 4.8 | 600 | 4000 | 5000 | 1000 | 1700 |
| 10 | HIHR-HPw | 200 | 4.8 | 600 | 4000 | 5000 | 1000 | 1800 |
| 11 | HIHR-HPw | 200 | 4.8 | 600 | 4000 | 5000 | 1000 | 1600 |
| 12 | HILR-LPw | 200 | 4.8 | 200 | 4000 | 5000 | 500 | 800 |
| 13 | HILR-LPw | 200 | 4.8 | 200 | 4000 | 5000 | 500 | 560 |
| 14 | HILR-LPw | 200 | 4.8 | 200 | 4000 | 5000 | 500 | 500 |

[1]The note indicates the relative amount of inert and reactive gases used in the process for ease of review and consideration (i.e. low amount of inert gas = LI, low amount of reactive gas = LR, high amount of inert gas = HI, high amount of reactive gas = HR).

TABLE 1B

| Sample | Note | Temperature °C. | Pressure Torr | Plasma Power W | He (5000 scc max) | Ar (5000 scc max) | SiH4-HI (1000 scc max) | CH4 (10 slm max 125-7200) |
|---|---|---|---|---|---|---|---|---|
| 15 | HIHR-LPw | 200 | 4.8 | 200 | 4000 | 5000 | 950 | 1600 |
| 16 | HIHR-LPw | 200 | 4.8 | 200 | 4000 | 5000 | 1000 | 1700 |
| 17 | HIHR-LPw | 200 | 4.8 | 200 | 4000 | 5000 | 1000 | 1800 |
| 18 | HIHR-HPw | 200 | 4.8 | 500 | 4000 | 5000 | 1000 | 1600 |
| 19 | HIHR-HPw | 200 | 4.8 | 400 | 4000 | 5000 | 1000 | 1600 |
| 20 | HIHR-LPw | 200 | 4.8 | 200 | 4000 | 5000 | 1000 | 1600 |
| 21 | HIHR-LPw | 200 | 4.8 | 100 | 4000 | 5000 | 1000 | 1600 |
| 22 | HIHR-LPw | 200 | 4.8 | 150 | 4000 | 5000 | 1000 | 1600 |
| 23 | HIHR-HPw | 200 | 5 | 600 | 4000 | 5000 | 1000 | 1600 |
| 24 | HIHR-LPw | 200 | 5 | 200 | 4000 | 5000 | 1000 | 1600 |
| 25 | HIHR-LPw-HT | 225 | 4.8 | 200 | 4000 | 5000 | 1000 | 3000 |
| 26 | HIHR-LPw-HT | 225 | 4.8 | 200 | 4000 | 5000 | 1000 | 2500 |
| 27 | HIHR-LPw-HT | 225 | 4.8 | 200 | 4000 | 5000 | 1000 | 2000 |

TABLE 2A

| Sample | Optical Loss dB/cm | Refractive Index | Rate (nm/sec) | Extinction Coeficient | Thickness uniformity 3sigma % | Refractive index 3sigma % | Extinction Coeficient 1sigma % |
|---|---|---|---|---|---|---|---|
| 1 (comp) | 716 | 2.70 | 8.6 | 0.0032 | 2.55% | 0.79% | 81.25% |
| 2 (comp) | 714 | 2.66 | 8.9 | 0.0016 | 4.53% | 0.88% | 100.00% |
| 3 (comp) | 437 | 2.93 | 10.4 | 0.0162 | 6.30% | 1.50% | 4.32% |
| 4 (comp) | 152 | 2.88 | 10.1 | 0.0107 | 2.89% | 0.84% | 10.50% |

TABLE 2A-continued

| Sample | Optical Loss dB/cm | Refractive Index | Rate (nm/sec) | Extinction Coeficient | Thickness uniformity 3sigma % | Refractive index 3sigma % | Extinction Coeficient 1sigma % |
|---|---|---|---|---|---|---|---|
| 5 (comp) | 134 | 2.82 | 10.4 | 0.0134 | 3.07% | 0.98% | 6.44% |
| 6 | 128 | 2.79 | 10.5 | 0.0152 | 3.27% | 0.97% | 7.24% |
| 7 | 126 | 2.76 | 10.6 | 0.0196 | 3.11% | 0.83% | 4.21% |
| 8 | 110 | 2.74 | 10.7 | 0.0199 | 3.50% | 0.85% | 4.49% |
| 9 | 102 | 2.71 | 10.9 | 0.019 | 4.65% | 2.99% | 20.53% |
| 10 | 100 | 2.69 | 10.9 | 0.02 | 4.87% | 1.00% | 6.00% |
| 11 | 109 | 2.72 | 10.8 | 0.0212 | 3.71% | 0.89% | 14.94% |
| 12 | 40 | 2.61 | 4.4 | 0.016 | 2.00% | 0.81% | 40.42% |
| 13 | 55 | 2.71 | 4.3 | 0.016 | 2.49% | 0.99% | 45.87% |
| 14 | 60 | 2.73 | 4.2 | 0.015 | 2.60% | 0.88% | 45.45% |

TABLE 2B

| Sample | Optical Loss dB/cm | Refractive Index | Rate (nm/sec) | Extinction Coeficient | Thickness uniformity 3sigma % | Refractive index 3sigma % | Extinction Coeficient 1sigma % |
|---|---|---|---|---|---|---|---|
| 15 | 38 | 2.69 | 5.1 | 0.041 | 2.25% | 0.74% | 2.02% |
| 16 | 33 | 2.69 | 5.3 | 0.039 | 2.11% | 0.56% | 1.78% |
| 17 | 35 | 2.68 | 5.2 | 0.039 | 1.44% | 0.64% | 2.24% |
| 18 | 73 | 2.72 | 9.5 | 0.026 | 4.16% | 0.99% | 5.00% |
| 19 | 59 | 2.71 | 8.3 | 0.015 | 3.64% | 1.03% | 10.95% |
| 20 | 32 | 2.69 | 5.2 | 0.031 | 3.09% | 0.78% | 5.72% |
| 21 | 39 | 2.81 | 2.9 | 0.065 | 7.38% | 0.53% | 3.03% |
| 22 | 34 | 2.74 | 4.2 | 0.048 | 2.97% | 0.58% | 3.57% |
| 23 | 101 | 2.71 | 10.9 | 0.02 | 3.82% | 2.32% | 28.00% |
| 24 | 37 | 2.70 | 5.2 | 0.04 | 2.33% | 0.63% | 1.61% |
| 25 | 30 | 2.71 | 5.2 | 0.04 | 2.50% | 0.63% | 2.79% |
| 26 | 35 | 2.75 | 5.3 | 0.038 | 2.03% | 0.60% | 3.37% |
| 27 | 38 | 2.79 | 5.4 | 0.034 | 2.05% | 0.51% | 3.92% |

TABLE 3A

| Sample | Reactive Gas SiH4 + CH4 sccm | Inert Gas He + Ar sccm | Total Gas sccm | R/I Gas Ratio |
|---|---|---|---|---|
| 1 (comp) | 1000 | 4500 | 5500 | 0.22 |
| 2 (comp) | 1060 | 4500 | 5560 | 0.24 |
| 3 (comp) | 2100 | 9000 | 11100 | 0.23 |
| 4 (comp) | 2000 | 9000 | 11000 | 0.22 |
| 5 (comp) | 2200 | 9000 | 11200 | 0.24 |
| 6 | 2300 | 9000 | 11300 | 0.26 |
| 7 | 2400 | 9000 | 11400 | 0.27 |
| 8 | 2500 | 9000 | 11500 | 0.28 |
| 9 | 2700 | 9000 | 11700 | 0.30 |
| 10 | 2800 | 9000 | 11800 | 0.31 |
| 11 | 2600 | 9000 | 11600 | 0.29 |
| 12 | 1300 | 9000 | 10300 | 0.14 |
| 13 | 1060 | 9000 | 10060 | 0.12 |
| 14 | 1000 | 9000 | 10000 | 0.11 |

TABLE 3B

| Sample | Reactive Gas SiH4 + CH4 sccm | Inert Gas He + Ar sccm | Total Gas sccm | R/I Gas Ratio |
|---|---|---|---|---|
| 15 | 2550 | 9000 | 11550 | 0.28 |
| 16 | 2700 | 9000 | 11700 | 0.30 |
| 17 | 2800 | 9000 | 11800 | 0.31 |
| 18 | 2600 | 9000 | 11600 | 0.29 |
| 19 | 2600 | 9000 | 11600 | 0.29 |
| 20 | 2600 | 9000 | 11600 | 0.29 |
| 21 | 2600 | 9000 | 11600 | 0.29 |
| 22 | 2600 | 9000 | 11600 | 0.29 |
| 23 | 2600 | 9000 | 11600 | 0.29 |
| 24 | 2600 | 9000 | 11600 | 0.29 |
| 25 | 4000 | 9000 | 13000 | 0.44 |
| 26 | 3500 | 9000 | 12500 | 0.39 |
| 27 | 3000 | 9000 | 12000 | 0.33 |

TABLE 4A

| Sample | SiH4:CH4 | He % | Ar % | SiH4 % | CH4 % | Reactive Gas % | Inert Gas % |
|---|---|---|---|---|---|---|---|
| 1 (comp) | 1.00 | 36% | 45% | 9% | 9% | 18% | 82% |
| 2 (comp) | 0.89 | 36% | 45% | 9% | 10% | 19% | 81% |
| 3 (comp) | 0.91 | 36% | 45% | 9% | 10% | 19% | 81% |
| 4 (comp) | 1.00 | 36% | 45% | 9% | 9% | 18% | 82% |
| 5 (comp) | 0.83 | 36% | 45% | 9% | 11% | 20% | 80% |
| 6 | 0.77 | 35% | 44% | 9% | 12% | 20% | 80% |
| 7 | 0.71 | 35% | 44% | 9% | 12% | 21% | 79% |
| 8 | 0.67 | 35% | 43% | 9% | 13% | 22% | 78% |
| 9 | 0.59 | 34% | 43% | 9% | 15% | 23% | 77% |

TABLE 4A-continued

| Sample | SiH4:CH4 | He % | Ar % | SiH4 % | CH4 % | Reactive Gas % | Inert Gas % |
|---|---|---|---|---|---|---|---|
| 10 | 0.56 | 34% | 42% | 8% | 15% | 24% | 76% |
| 11 | 0.63 | 34% | 43% | 9% | 14% | 22% | 78% |
| 12 | 0.63 | 39% | 49% | 5% | 8% | 13% | 87% |
| 13 | 0.89 | 40% | 50% | 5% | 6% | 11% | 89% |
| 14 | 1.00 | 40% | 50% | 5% | 5% | 10% | 90% |

TABLE 4B

| Sample | SiH4:CH4 | He % | Ar % | SiH4 % | CH4 % | Reactive Gas % | Inert Gas % |
|---|---|---|---|---|---|---|---|
| 15 | 0.59 | 35% | 43% | 8% | 14% | 22% | 78% |
| 16 | 0.59 | 34% | 43% | 9% | 15% | 23% | 77% |
| 17 | 0.56 | 34% | 42% | 8% | 15% | 24% | 76% |
| 18 | 0.63 | 34% | 43% | 9% | 14% | 22% | 78% |
| 19 | 0.63 | 34% | 43% | 9% | 14% | 22% | 78% |
| 20 | 0.63 | 34% | 43% | 9% | 14% | 22% | 78% |
| 21 | 0.63 | 34% | 43% | 9% | 14% | 22% | 78% |
| 22 | 0.63 | 34% | 43% | 9% | 14% | 22% | 78% |
| 23 | 0.63 | 34% | 43% | 9% | 14% | 22% | 78% |
| 24 | 0.63 | 34% | 43% | 9% | 14% | 22% | 78% |
| 25 | 0.33 | 31% | 38% | 8% | 23% | 31% | 69% |
| 26 | 0.40 | 32% | 40% | 8% | 20% | 28% | 72% |
| 27 | 0.50 | 33% | 42% | 8% | 17% | 25% | 75% |

The examples show that by selection of reactive gases and a mixture of inert gases, and control of gas flows to provide atomic concentration ratios and relative gas volume ratios under specified plasma reaction conditions, amorphous hydrogenated silicon carbide layers may be prepared that exhibit a refractive index of not less than 2.4 and a loss of not more than 180 dB/cm at selected wavelengths.

What is claimed is:

1. A method for depositing a layer of amorphous hydrogenated silicon carbide (SiC:H), comprising
    a) introducing a gas mixture comprising a reactive gas and an inert gas into a reaction chamber of a plasma-enhanced chemical vapor deposition apparatus at a reactive gas to inert gas volume ratio of 1:12 to 2:3, wherein
        the reactive gas comprises a silicon source and a carbon source, and
        the inert gas comprises i) a first inert gas selected from the group consisting of helium, neon and mixtures thereof and ii) a second inert gas selected from the group consisting of argon, krypton, xenon and mixtures thereof, the inert gas having a volume ratio of first inert gas to second inert gas of 2:5 to 6:5; and
    b) reacting the reactive gas in the presence of a plasma; wherein
        the plasma is generated using plasma generation power at a frequency of from about 1-16 MHz at a power level of from 50 W to 300 W,
        the reactive gas and the inert gas are introduced at a total reactive gas flow rate of from 1000 sccm to 4000 sccm and a total inert gas flow rate of from 6000 sccm to 12,000 sccm, the total reactive gas flow rate and the total inert gas flow rate and the plasma conditions being sufficient to provide the amorphous hydrogenated silicon carbide layer having an atomic concentration ratio of Si of 50 at % to 60 at %, C of 3 at % to 13 at %, and H of 32 at % to 42 at % at a deposition rate of amorphous hydrogenated silicon carbide of from about 2 nm/sec to about 6 nm/sec, and
    the total reactive gas flow rate and the total inert gas flow rate and plasma conditions being such that the amorphous hydrogenated silicon carbide layer as deposited exhibits both a refractive index of not less than 2.6 and an optical loss of not more than 120 dB/cm at a wavelength of 825 nm.

2. The method of claim 1, wherein the silicon source comprises silane ($SiH_4$) and the carbon source comprises methane ($CH_4$).

3. The method of claim 1, wherein the amorphous hydrogenated silicon carbide layer has an atomic concentration ratio of Si of 52 at % to 58 at %, C of 5 at % to 11 at %, and H of 34 at % to 40 at %.

4. The method of claim 1, wherein the total reactive gas flow rate of is from 1200 sccm to 4000 sccm.

5. The method of claim 1, wherein the reaction of the reactive gas is carried out at a substrate temperature of not more than 250° C.

6. The method of claim 1, wherein the reaction of the reactive gas is carried out at a substrate temperature of from 200° C. to 225° C.

7. The method of claim 1, wherein the amorphous hydrogenated silicon carbide layer exhibits a refractive index of not less than 2.8.

8. The method of claim 1, wherein the optical loss is not more than 100 dB/cm.

9. The method of claim 1, wherein the optical loss is not more than 50 dB/cm.

10. The method of claim 1, wherein
    the amorphous hydrogenated silicon carbide layer has an atomic concentration ratio of Si of 52 at % to 58 at %, C of 3 at % to 13 at %, and H of 36 at % to 39 at %;
    the reaction of the reactive gas is carried out at a substrate temperature of from 200° C. to 225° C.

11. The method of claim 1, wherein the total reactive gas flow rate of is from 2500 sccm to 4000 sccm.

* * * * *

UNITED STATES PATENT AND TRADEMARK OFFICE
CERTIFICATE OF CORRECTION

PATENT NO. : 11,142,820 B2
APPLICATION NO. : 16/250488
DATED : October 12, 2021
INVENTOR(S) : Xiaoyue Huang et al.

It is certified that error appears in the above-identified patent and that said Letters Patent is hereby corrected as shown below:

In the Claims

Column 12, Claim 10, Line 66, "the reaction of the reactive gas is carried out at a substrate" should be
– and the reaction of the reactive gas is carried out at a substrate –

Signed and Sealed this
Thirty-first Day of May, 2022

Katherine Kelly Vidal
*Director of the United States Patent and Trademark Office*